(12) United States Patent
Govyadinov et al.

(10) Patent No.: US 10,589,269 B2
(45) Date of Patent: Mar. 17, 2020

(54) MICROFLUIDIC TRANSPORT

(71) Applicant: Hewlett-Packard Development Company, L.P., Houston, TX (US)

(72) Inventors: Alexander Govyadinov, Corvallis, OR (US); Erik D Torniainen, Corvallis, OR (US); Pavel Kornilovich, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 89 days.

(21) Appl. No.: 15/547,751

(22) PCT Filed: Jan. 30, 2015

(86) PCT No.: PCT/US2015/013894
§ 371 (c)(1),
(2) Date: Jul. 31, 2017

(87) PCT Pub. No.: WO2016/122635
PCT Pub. Date: Aug. 4, 2016

(65) Prior Publication Data
US 2018/0029032 A1 Feb. 1, 2018

(51) Int. Cl.
*B01L 3/00* (2006.01)
*B81B 7/00* (2006.01)

(52) U.S. Cl.
CPC ..... *B01L 3/50273* (2013.01); *B01L 3/502753* (2013.01); *B01L 2300/0681* (2013.01); *B01L 2300/088* (2013.01); *B01L 2300/0867* (2013.01); *B01L 2400/0439* (2013.01); *B01L 2400/0442* (2013.01); *B81B 7/00* (2013.01)

(58) Field of Classification Search
CPC .................................................. B01L 3/50273
USPC .......................................................... 422/502
See application file for complete search history.

(56) References Cited

U.S. PATENT DOCUMENTS

| 6,942,771 B1 | 9/2005 | Kayyem |
| 2003/0235504 A1 | 12/2003 | Lemoff et al. |
| 2005/0097951 A1 | 5/2005 | Hasselbrink et al. |

(Continued)

FOREIGN PATENT DOCUMENTS

| CN | 1548957 A | 11/2004 |
| CN | 101031500 A | 9/2007 |

(Continued)

OTHER PUBLICATIONS

International Search Report, dated Sep. 11, 2015, PCT Patent Application No. PCT/US2015/013894.

(Continued)

*Primary Examiner* — Christine T Mui
*Assistant Examiner* — Emily R. Berkeley
(74) *Attorney, Agent, or Firm* — Perry + Currier Inc

(57) ABSTRACT

A device for microfluidic transport includes a first fluid reservoir, a second fluid reservoir spaced from the first fluid reservoir, a main fluid channel communicated with the first fluid reservoir and the second fluid reservoir, an auxiliary fluid channel communicated with the main fluid channel, and a fluid actuator within the auxiliary fluid channel asymmetric to the main fluid channel such that operation of the fluidic actuator is to induce fluid flow in the main fluid channel from the first reservoir toward the second reservoir.

15 Claims, 4 Drawing Sheets

(56) References Cited

U.S. PATENT DOCUMENTS

| | | |
|---|---|---|
| 2008/0050804 A1 | 2/2008 | Kalyan et al. |
| 2009/0257886 A1 | 10/2009 | Rosenstein et al. |
| 2011/0259742 A1 | 10/2011 | Li et al. |
| 2011/0286493 A1 | 11/2011 | Torniainen et al. |
| 2012/0136492 A1* | 5/2012 | Amin .................. B01F 5/102 700/285 |
| 2013/0014843 A1 | 1/2013 | Wright |
| 2013/0183209 A1 | 7/2013 | Richter et al. |
| 2013/0263649 A1 | 10/2013 | Storch et al. |
| 2014/0065631 A1 | 3/2014 | Froehlich et al. |
| 2014/0377145 A1 | 12/2014 | Govyadinov et al. |

FOREIGN PATENT DOCUMENTS

| | | |
|---|---|---|
| TW | 201043786 A | 12/2010 |
| WO | WO-2014178827 | 11/2014 |

OTHER PUBLICATIONS

McGuinness et al., Microfluidic Sensing Device, Appln. No. PCT/US2014/0137848; Filed Jan. 30, 2014.

Tsai, J-H. et al., "Active Microfluidic Mixer and Gas Bubble Filter Driven by Thermal Bubble Micropump", Apr. 1, 2002, 3 pgs.

\* cited by examiner

MICROFLUIDIC TRANSPORT

BACKGROUND

Microfluidics involves the study of small volumes of fluid and how to manipulate, control and use such small volumes of fluid in various systems and devices, such as microfluidic chips. In some instances, microfluidic chips may be used in the medical and biological fields to evaluate fluids and their components.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure.

Examples of the present disclosure are directed to a microfluidic device which may be used, for example, to process and evaluate biologic fluids. In some examples, such processing and evaluation involves microfluidic flow control and transport. Accordingly, examples of the present disclosure involve controlling fluid flow within and/or through a fluid channel of a microfluidic device.

Figure 1:
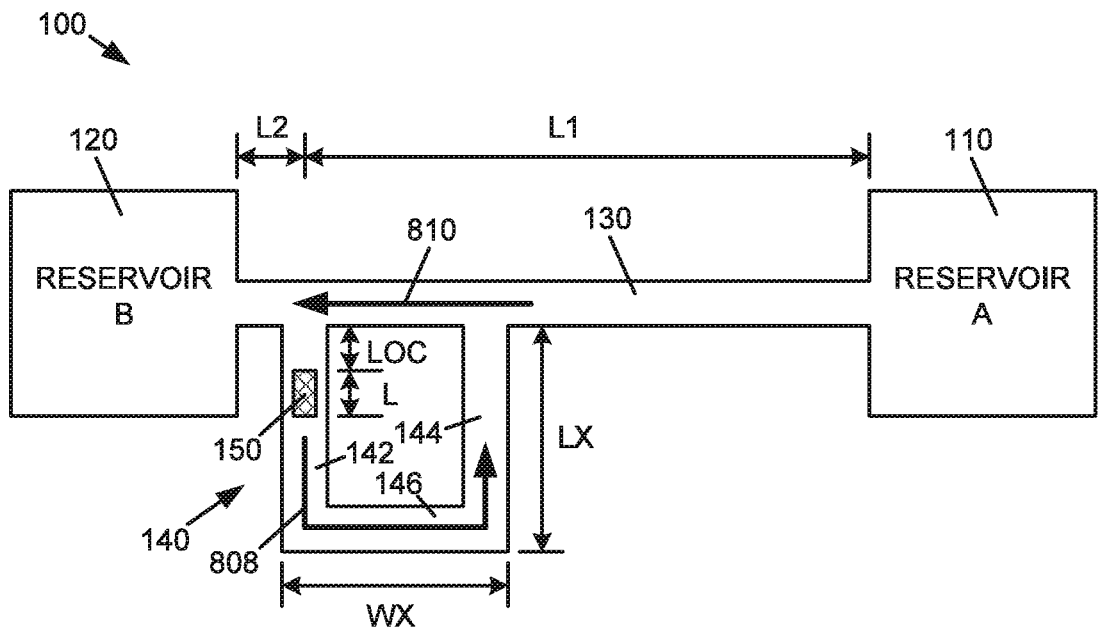
FIG. 1 is a schematic diagram illustrating one example of a device for microfluidic transport.

FIG. 1 is a schematic diagram illustrating one example of a microfluidic device 100 for microfluidic transport. Microfluidic device 100 includes a fluid reservoir 110, a fluid reservoir 120, a main fluid channel 130, an auxiliary fluid channel 140, and a fluid actuator 150. Fluid reservoir 110 and fluid reservoir 120 may be spaced from each other, and may each contain or receive a fluid or mixture of fluids, such as a biologic fluid, or other liquids, fluids, or flowable materials.

In one example, main fluid channel 130 is communicated at one end with fluid reservoir 110 and communicated at an opposite end with fluid reservoir 120 such that main fluid channel 130 extends between fluid reservoir 110 and fluid reservoir 120. In addition, auxiliary fluid channel 140 is communicated with main fluid channel 130, and fluid actuator 150 is formed in, provided within, or communicated with auxiliary fluid channel 140. As described below, activation or operation of fluid actuator 150 induces fluid flow in main fluid channel 130 between fluid reservoir 110 and fluid reservoir 120. In addition to fluid communication through main fluid channel 130, fluid reservoir 110 and fluid reservoir 120 may be otherwise fluidically communicated with each other.

In the example illustrated in FIG. 1, auxiliary fluid channel 140 is a U-shaped channel and includes a segment or leg 142 communicated with main fluid channel 130, a segment or leg 144 communicated with main fluid channel 130, and a segment or leg 146 extended between leg 142 and leg 144. As such, in one example, leg 142, leg 144, and leg 146 form a fluid channel loop.

In one example, auxiliary fluid channel 140 is asymmetric to main fluid channel 130 in that auxiliary fluid channel 140 is offset from or offset relative to a midpoint of main fluid channel 130 between fluid reservoir 110 and fluid reservoir 120. More specifically, leg 142 and/or leg 144 of auxiliary fluid channel 140 are/is offset from or offset relative to a midpoint of main fluid channel 130 between fluid reservoir 110 and fluid reservoir 120. Thus, auxiliary fluid channel 140 is also asymmetric to fluid reservoirs 110 and 120. As described below, asymmetry of auxiliary fluid channel 140 may contribute to the transport of fluid (i.e., microfluidic transport of fluid) in or through main fluid channel 130 between fluid reservoir 110 and fluid reservoir 120.

In one example, as illustrated in FIG. 1, fluid actuator 150 is positioned along or provided within a leg of auxiliary fluid channel 140 such as, for example, leg 142. Fluid actuator 150, however, may be positioned in or at other locations of auxiliary fluid channel 140. In addition, fluid actuator 150 may include multiple fluid actuators formed in, provided within, or communicated with auxiliary fluid channel 140.

Fluid actuator 150 may be any device which produces displacement of fluid within auxiliary fluid channel 140. In one example, fluid actuator 150 represents a fluidic inertial pump, and may be implemented as a variety of structures. For example, fluid actuator 150 may be implemented as a thermal resistor which creates a nucleating vapor bubble that produces displacement of fluid within auxiliary fluid channel 140. In addition, fluid actuator 150 may be implemented as a piezoelectric actuator which includes a piezoelectric material provided on a moveable membrane such that, when activated, the piezoelectric material causes deflection of the membrane, thereby generating a pressure pulse that produces displacement of fluid within auxiliary fluid channel 140. Other deflective membrane elements activated by electrical, magnetic, or other forces are also possible for use in implementing fluid actuator 150.

As illustrated in the example of FIG. 1, fluid actuator 150 is asymmetric to main fluid channel 130 in that fluid actuator 150 is offset from or offset relative to a midpoint of main fluid channel 130 between fluid reservoir 110 and fluid reservoir 120. More specifically, a position of fluid actuator 150 along and with reference to main fluid channel 130 is offset from or offset relative to a midpoint of main fluid channel 130 between fluid reservoir 110 and fluid reservoir 120. Thus, fluid actuator 150 is also asymmetric to fluid reservoirs 110 and 120. As described below, asymmetry of fluid actuator 150 may contribute to the transport of fluid (i.e., microfluidic transport of fluid) in or through main fluid channel 130 between fluid reservoir 110 and fluid reservoir 120.

In one example, various parameters of microfluidic device 100 are selected or defined to optimize performance of microfluidic device 100. With reference to FIG. 1, such parameters are identified as and include, for example, the following:

L1—main channel length

L2—main channel length

LX—auxiliary channel length
WX—auxiliary channel width
LOC—fluid actuator location
L—fluid actuator length As such, in one example, main channel length (L1) is defined as a distance from fluid reservoir 110 to the location of fluid actuator 150 along and with reference to main fluid channel 130, and main channel length (L2) is defined as a distance from fluid reservoir 120 to the location of fluid actuator 150 along and with reference to main fluid channel 130. Accordingly, asymmetry of microfluidic device 100 includes main channel length (L1) being greater than main channel length (L2). In addition, in one example, auxiliary channel length (LX) is defined as a length, for example, of legs 142 and 144 of auxiliary fluid channel 140, and auxiliary channel width (WX) is defined as a width, for example, of leg 146 of auxiliary fluid channel 140. Furthermore, in one example, fluid actuator location (LOC) is defined as a distance from main fluid channel 130 to fluid actuator 150, and fluid actuator length (L) is defined as a length of fluid actuator 150.

Figure 2:
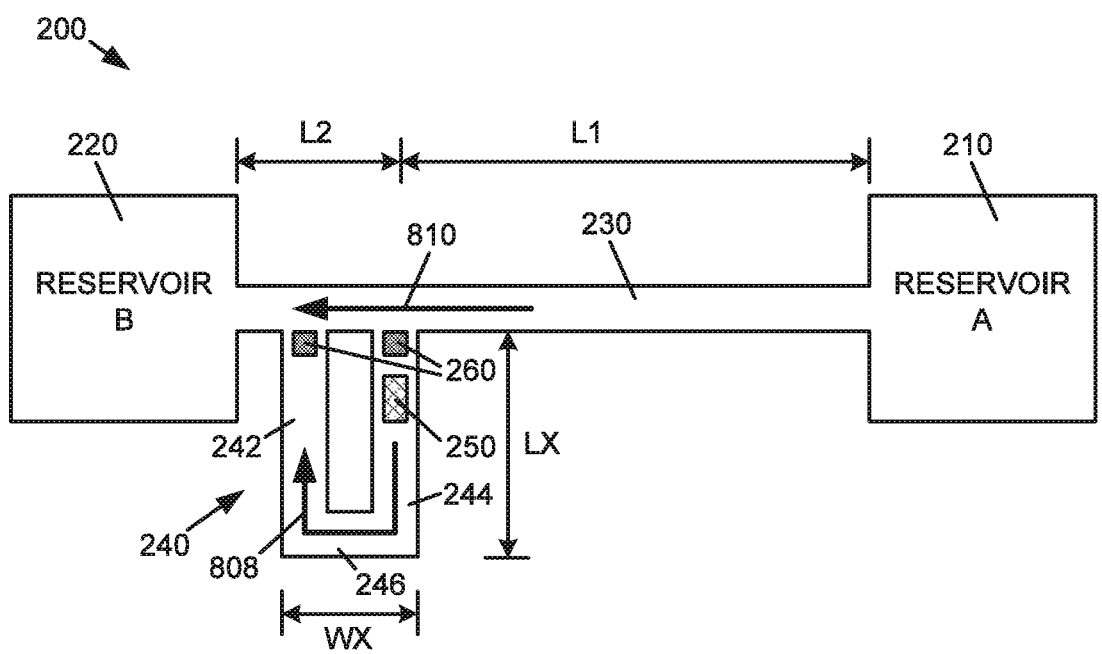
FIG. 2 is a schematic diagram illustrating another example of a device for microfluidic transport.

FIG. 2 is a schematic diagram illustrating another example of a microfluidic device 200 for microfluidic transport. Similar to microfluidic device 100, microfluidic device 200 includes a fluid reservoir 210, a fluid reservoir 220, a main fluid channel 230, an auxiliary fluid channel 240, and a fluid actuator 250. In addition, similar to auxiliary fluid channel 140 of microfluidic device 100, auxiliary fluid channel 240 of microfluidic device 200 is a U-shaped channel and includes a segment or leg 242 communicated with main fluid channel 230, a segment or leg 244 communicated with main fluid channel 230, and a segment or leg 246 extended between leg 242 and leg 244. As such, in one example, leg 242, leg 244, and leg 246 form a fluid channel loop.

As illustrated in the example of FIG. 2, fluid actuator 250 is positioned in leg 244 of auxiliary fluid channel 240. In addition, compared to microfluidic device 100, auxiliary channel width (WX) of microfluidic device 200 is less than auxiliary channel width (WX) of microfluidic device 100. Thus, compared to microfluidic device 100, main channel length (L1) of microfluidic device 200 is less than main channel length (L1) of microfluidic device 100. However, similar to microfluidic device 100, auxiliary fluid channel 240 and fluid actuator 250 of microfluidic device 200 are each asymmetric to main fluid channel 230, and asymmetric to fluid reservoirs 210 and 220.

In one example, as illustrated in FIG. 2, microfluidic device 200 includes filters 260. Filter 260 is provided to prevent certain particles (e.g., foreign particles or select components of the fluid) from flowing into auxiliary fluid channel 240 from main fluid channel 230. In one example, filter 260 is positioned in leg 244 of auxiliary fluid channel 240 between main fluid channel 230 and fluid actuator 250. As such, filter 260 precludes and/or protects certain particles from contact or interaction with fluid actuator 250. In one example, in addition to leg 244, filter 260 may also be positioned in leg 242 of auxiliary fluid channel 240. Thus, filter 260 prevents certain particles from entering auxiliary fluid channel 240

In one example, filter 260 includes a particle tolerant architecture. Particle tolerant architecture (PTA) may include, for example, a pillar, a column, a post or other structure (or structures) formed in or provided within auxiliary fluid channel 240. As such, the particle tolerant architecture forms an "island" in auxiliary fluid channel 240 which allows fluid flow into auxiliary fluid channel 240 while preventing certain particles from flowing into auxiliary fluid channel 240. In one example, the particle tolerant architecture is formed within auxiliary fluid channel 240 toward or at an end of auxiliary fluid channel 240 as communicated with main fluid channel 230.

Filter 260 may also include a porous membrane which allows fluid to pass therethrough while blocking certain particles. Furthermore, auxiliary fluid channel 240 may include a narrowing, for example, of leg 242 and/or leg 244 toward or at an end of auxiliary fluid channel 240 to prevent certain particles from flowing into auxiliary fluid channel 240.

Figure 3:
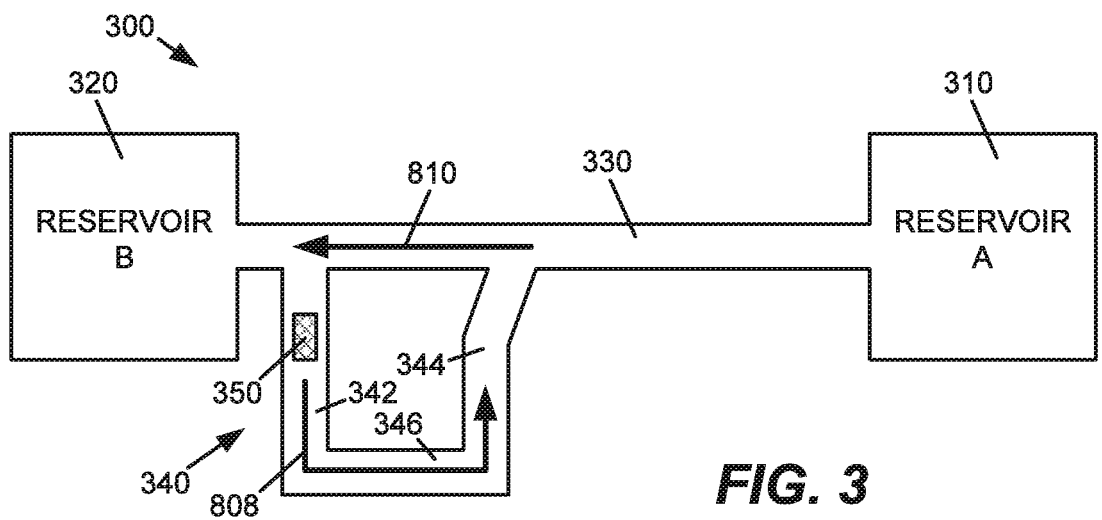
FIG. 3 is a schematic diagram illustrating another example of a device for microfluidic transport.

FIG. 3 is a schematic diagram illustrating another example of a microfluidic device 300 for microfluidic transport. Similar to microfluidic device 100, microfluidic device 300 includes a fluid reservoir 310, a fluid reservoir 320, a main fluid channel 330, an auxiliary fluid channel 340, and a fluid actuator 350. In addition, similar to auxiliary fluid channel 140 of microfluidic device 100, auxiliary fluid channel 340 of microfluidic device 300 includes a segment or leg 342 communicated with main fluid channel 330, a segment or leg 344 communicated with main fluid channel 330, and a segment or leg 346 extended between leg 342 and leg 344. As such, in one example, leg 342, leg 344, and leg 346 form a fluid channel loop.

Figure 4:
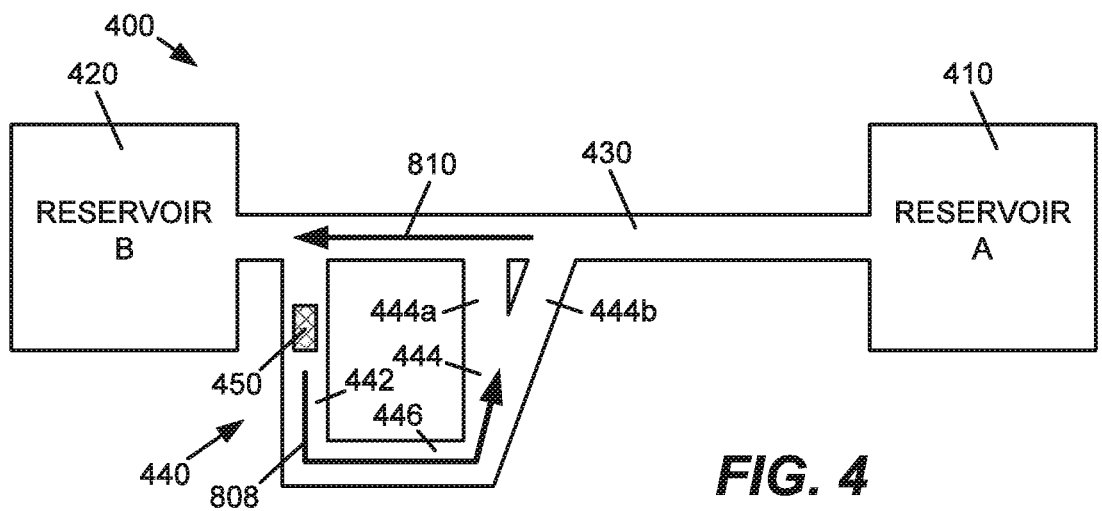
FIG. 4 is a schematic diagram illustrating another example of a device for microfluidic transport.

FIG. 4 is a schematic diagram illustrating another example of a microfluidic device 400 for microfluidic transport. Similar to microfluidic device 100, microfluidic device 400 includes a fluid reservoir 410, a fluid reservoir 420, a main fluid channel 430, an auxiliary fluid channel 440, and a fluid actuator 450. In addition, similar to auxiliary fluid channel 140 of microfluidic device 100, auxiliary fluid channel 440 of microfluidic device 400 includes a segment or leg 442 communicated with main fluid channel 430, a segment or leg 444 including sub-segments or sub-legs 444a and 444b communicated with main fluid channel 430, and a segment or leg 446 extended between leg 442 and leg 444 (including sub-legs 444a and 444b), with sub-segments or sub-legs 444a and 444b forming a split of segment or leg 444. As such, in one example, leg 442, leg 444 (including sub-legs 444a and 444b), and leg 446 form a fluid channel loop.

Figure 5:
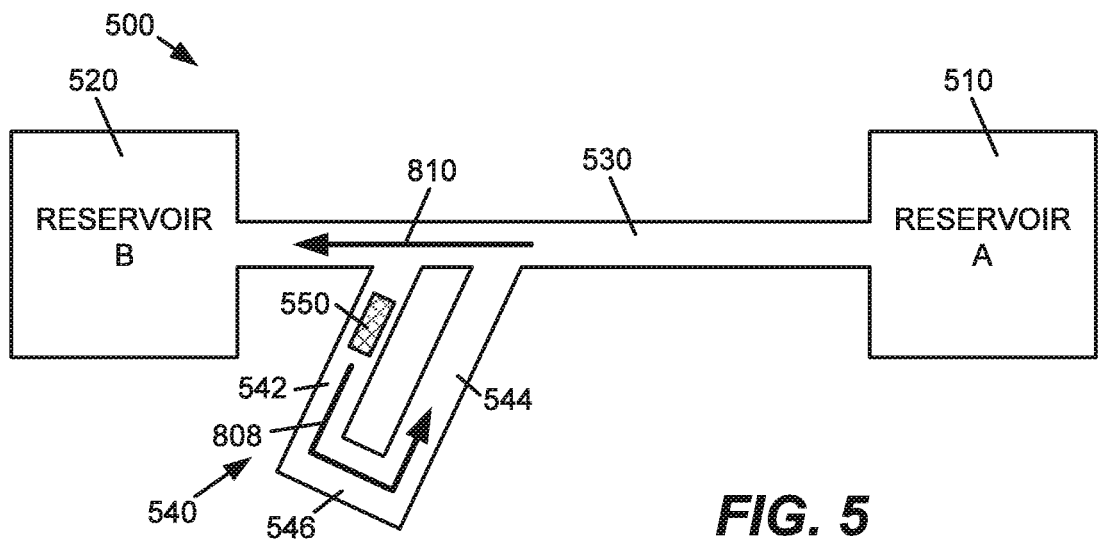
FIG. 5 is a schematic diagram illustrating another example of a device for microfluidic transport.

FIG. 5 is a schematic diagram illustrating another example of a microfluidic device 500 for microfluidic transport. Similar to microfluidic device 100, microfluidic device 500 includes a fluid reservoir 510, a fluid reservoir 520, a main fluid channel 530, an auxiliary fluid channel 540, and a fluid actuator 550. In addition, similar to auxiliary fluid channel 140 of microfluidic device 100, auxiliary fluid channel 540 of microfluidic device 500 includes a segment or leg 542 communicated with main fluid channel 530, a segment or leg 544 communicated with main fluid channel 530, and a segment or leg 546 extended between leg 542 and leg 544. As such, in one example, leg 542, leg 544, and leg 546 form a fluid channel loop.

While auxiliary fluid channel 140 and auxiliary fluid channel 240 are illustrated as being U-shaped in the examples of FIGS. 1 and 2, respectively, the auxiliary fluid channel may include other shapes, configurations, and/or arrangements. For example, as illustrated in the examples of FIGS. 3, 4, and 5, and described below, one leg, both legs, and/or a portion or portions of any of the legs of the auxiliary fluid channel may be oriented at an angle (non-zero angle) to the main fluid channel.

For example, as illustrated in the example of FIG. 3, a portion of leg 344 of auxiliary channel 340 is oriented at an angle to main fluid channel 330. In addition, as illustrated in the example of FIG. 4, leg 444 of auxiliary channel 440 includes sub-leg 444b oriented at an angle to main fluid channel 430. Furthermore, as illustrated in the example of FIG. 5, legs 542 and 544 of auxiliary fluid channel 540 are each oriented at an angle to main fluid channel 530. Other angles, configurations, and/or arrangements of the auxiliary fluid channel, however, are also possible. For example, the segments or legs of the auxiliary fluid channel may be of variable dimensions (width and height), and may include rounded or curved corners or segments.

Figure 6:
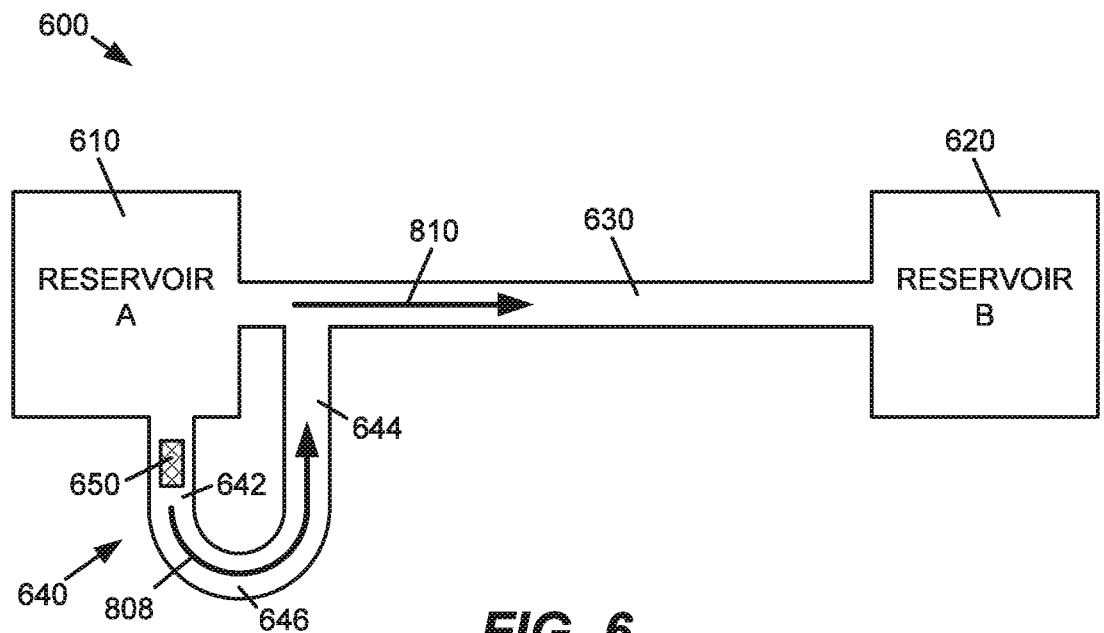
FIG. 6 is a schematic diagram illustrating another example of a device for microfluidic transport.

FIG. 6 is a schematic diagram illustrating another example of a microfluidic device 600 for microfluidic transport. Similar to microfluidic device 100, microfluidic device 600 includes a fluid reservoir 610, a fluid reservoir 620, a main fluid channel 630, an auxiliary fluid channel 640, and a fluid actuator 650.

In the example illustrated in FIG. 6, auxiliary fluid channel 640 of microfluidic device 600 is communicated with fluid reservoir 610 and main fluid channel 630. More specifically, in one example, auxiliary fluid channel 640 includes a leg or segment 642 communicated with fluid reservoir 610, a leg or segment 644 communicated with main fluid channel 630, and a leg or segment 646 between segment 642 and segment 644. In one example, auxiliary fluid channel 640 is a U-shaped channel such that segment 642, segment 644, and segment 646, as a curved portion of auxiliary fluid channel 640, form a fluid channel loop. As such, in one example, fluid actuator 650 is positioned along or provided within segment 642 of auxiliary fluid channel 640. Accordingly, auxiliary fluid channel 640 is asymmetric to main fluid channel 630 and asymmetric to fluid reservoirs 610 and 620, and fluid actuator 650 is asymmetric to main fluid channel 630 and asymmetric to fluid reservoirs 610 and 620. As described below, asymmetry of auxiliary fluid channel 640, and asymmetry of fluid actuator 650 contribute to the transport of fluid in or through main fluid channel 630 between fluid reservoir 610 and fluid reservoir 620.

Figure 7:
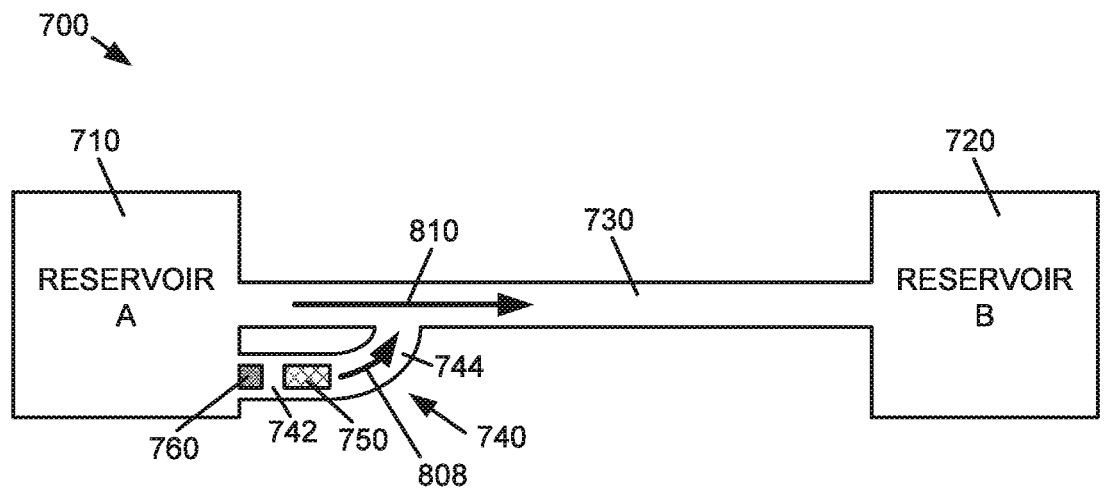
FIG. 7 is a schematic diagram illustrating another example of a device for microfluidic transport.

FIG. 7 is a schematic diagram illustrating another example of a microfluidic device 700 for microfluidic transport. Similar to microfluidic device 100, microfluidic device 700 includes a fluid reservoir 710, a fluid reservoir 720, a main fluid channel 730, an auxiliary fluid channel 740, and a fluid actuator 750.

In the example illustrated in FIG. 7, auxiliary fluid channel 740 of microfluidic device 700 is communicated with fluid reservoir 710 and main fluid channel 730. More specifically, in one example, auxiliary fluid channel 740 includes a segment 742 communicated with fluid reservoir 710, and a segment 744 communicated with main fluid channel 730. In one example, segment 744 provides a curved portion to auxiliary fluid channel 740 communicated with main fluid channel 730. As such, in one example, fluid actuator 750 is positioned along or provided within segment 742 of auxiliary fluid channel 740. Accordingly, auxiliary fluid channel 740 is asymmetric to main fluid channel 730 and asymmetric to fluid reservoirs 710 and 720, and fluid actuator 750 is asymmetric to main fluid channel 730 and asymmetric to fluid reservoirs 710 and 720. As described below, asymmetry of auxiliary fluid channel 740, and asymmetry of fluid actuator 750 contribute to the transport of fluid in or through main fluid channel 730 between fluid reservoir 710 and fluid reservoir 720.

In one example, similar to microfluidic device 200, microfluidic device 700 includes a filter 760 to prevent certain particles (e.g., foreign particles or select components of the fluid) from flowing into auxiliary fluid channel 740. As illustrated in the example of FIG. 7, filter 760 is provided in segment 742 of auxiliary fluid channel 740 between fluid reservoir 710 and fluid actuator 750. As such, filter 760 precludes or protects certain particles from contact or interaction with fluid actuator 750. Similar to filter 260 of microfluidic device 200, filter 760 may include a particle tolerant architecture, a porous membrane, or a narrowing of auxiliary fluid channel 740 to prevent certain particles from flowing into auxiliary fluid channel 740.

Figure 8:
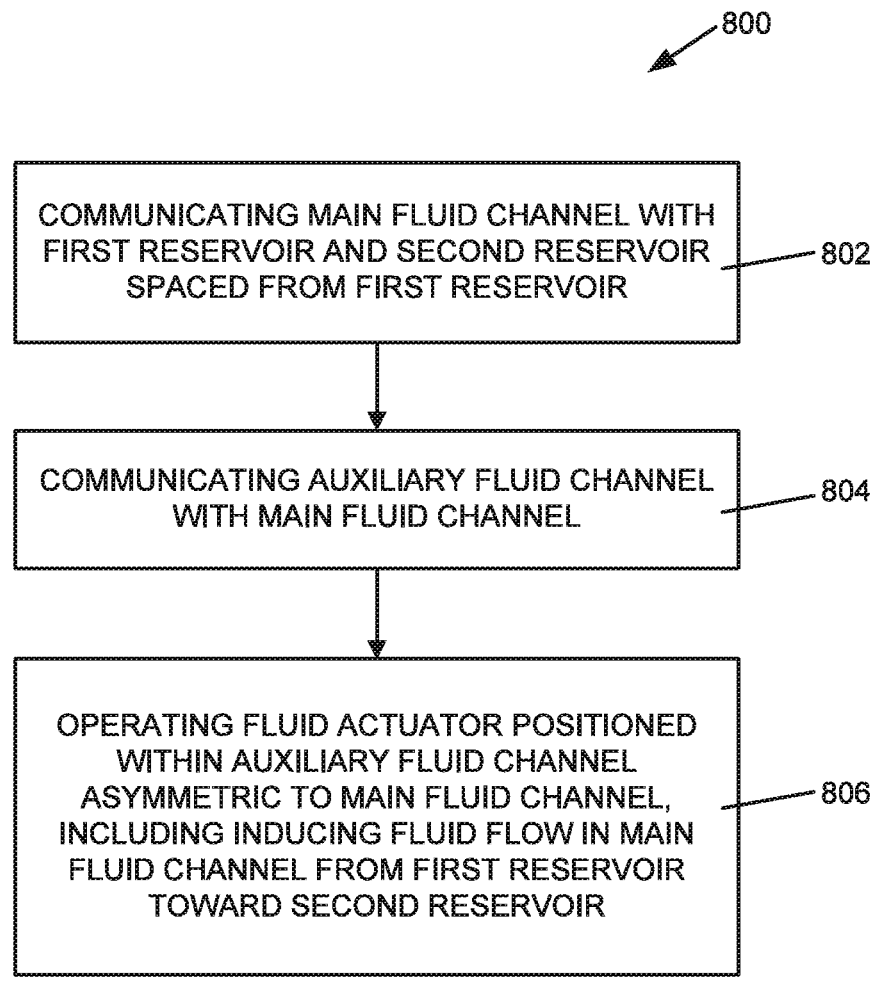
FIG. 8 is a flow diagram illustrating one example of a method of microfluidic transport.

FIG. 8 is a flow diagram illustrating one example of a method 800 of microfluidic transport with a microfluidic device, such as microfluidic devices 100, 200, 300, 400, 500, 600, and 700, as illustrated in the examples of FIGS. 1, 2, 3, 4, 5, 6, and 7, respectively.

At 802, method 800 includes communicating a main fluid channel, such as main fluid channel 130, 230, 330, 430, 530, 630, 730, with a first reservoir and a second reservoir spaced from the first reservoir, such as fluid reservoirs 110 and 120, 210 and 220, 310 and 320, 410 and 420, 510 and 520, 610 and 620, 710 and 720. At 804, method 800 includes communicating an auxiliary fluid channel, such as auxiliary fluid channel 140, 240, 340, 440, 540, 640, 740, with the main fluid channel, such as main fluid channel 130, 230, 330, 430, 530, 630, 730.

At 806, method 800 includes operating a fluid actuator positioned within the auxiliary fluid channel asymmetric to the main fluid channel, such as fluid actuator 150, 250, 350, 450, 550, 650, 750 positioned within auxiliary fluid channel 140, 240, 340, 440, 540, 640, 740 asymmetric to main fluid channel 130, 230, 330, 430, 530, 630, 730. As such, 806 of method 800 includes inducing fluid flow in the main fluid channel from the first reservoir toward the second reservoir, such as in main fluid channel 130, 230, 330, 430, 530, 630, 730 from fluid reservoir 110, 210, 310, 410, 510, 610, 710 toward fluid reservoir 120, 220, 320, 420, 520, 620, 720

More specifically, as illustrated in the examples of FIGS. 1, 2, 3, 4, 5, 6, and 7, operating or activation of the fluid actuator, such as fluid actuator 150, 250, 350, 450, 550, 650, 750, produces auxiliary fluid flow in auxiliary fluid channel, such as auxiliary fluid channel 140, 240, 340, 440, 540, 640, 740, as represented by arrow 808, which, in turn, produces main fluid flow in main fluid channel, such as main fluid channel 130, 230, 330, 430, 530, 630, 730, as represented by arrow 810. Thus, fluid flow is provided in or through the main fluid channel, such as main fluid channel 130, 230, 330, 430, 530, 630, 730, between the fluid reservoirs, such as fluid reservoirs 110 and 120, 210 and 220, 310 and 320, 410 and 420, 510 and 520, 610 and 620, 710 and 720.

Although illustrated and described as separate and/or sequential steps, the method may include a different order or sequence of steps, and may combine steps or perform steps concurrently, partially or wholly.

A microfluidic device including microfluidic flow control and transport as described herein, may, in some examples, provide the ability to move fluid through a fluid channel using a "non-contact" or "soft pumping" approach. More specifically, by including a fluid actuator (i.e., fluid pump) in an auxiliary fluid channel asymmetric to a main fluid channel, as described herein, exposure of the fluid to the fluid actuator and, therefore, exposure of the fluid to possible temperature and/or pressure impacts of the fluid actuator, may be reduced or avoided, for example.

A microfluidic device as described herein, may, in some examples, have application in the areas of micro-fluidics, green chemistry, chemical synthesis, chemical analysis, biological analysis and detection, biological synthesis, medical diagnosis, and others. For example, the fluid actuator, auxiliary fluid channel, and main fluid channel arrangement described herein allows for microfluidic flow control and transport while reducing exposure of material, for example, fragile material, such as biological or bio-chemical objects/cells, to possible temperature and/or pressure of the fluid actuator In some examples, by including a filter (e.g., PTA, porous membrane) at or near an entry and/or exit of the auxiliary fluid channel, certain fluidic components, for example, solid particles or fragile components, such as cells, may be prevented from entering the auxiliary fluid channel and, therefore, may be precluded from and/or protected from exposure to temperature and/or pressure (i.e., potentially degrading temperature and/or pressure) of the fluid actuator.

Although specific examples have been illustrated and described herein, it will be appreciated by those of ordinary skill in the art that a variety of alternate and/or equivalent implementations may be substituted for the specific examples shown and described without departing from the scope of the present disclosure. This application is intended to cover any adaptations or variations of the specific examples discussed herein.

The invention claimed is:

1. A device for microfluidic transport, comprising:
   a first fluid reservoir;
   a second fluid reservoir spaced from the first fluid reservoir;
   a main fluid channel communicated with the first fluid reservoir and the second fluid reservoir, wherein the main fluid channel is to provide a direct path for fluid flow;
   an auxiliary fluid channel communicated with the main fluid channel, the auxiliary fluid channel being outside the direct path of the main fluid channel; and
   a fluid actuator within the auxiliary fluid channel, wherein the fluid actuator is asymmetric to the main fluid channel, and wherein operation of the fluid actuator is to induce the fluid flow in the direct path for fluid flow through the main fluid channel from the first fluid reservoir toward the second fluid reservoir.

2. The device of claim 1, wherein the auxiliary fluid channel has a first end communicated with the first fluid reservoir and a second end communicated with the main fluid channel.

3. The device of claim 1, wherein the auxiliary fluid channel has a first end and a second end each communicated with the main fluid channel.

4. The device of claim 1, wherein the auxiliary fluid channel is communicated asymmetrically with the main fluid channel.

5. The device of claim 1, wherein the auxiliary fluid channel includes a segment communicated with and oriented at a non-zero angle to the main fluid channel.

6. The device of claim 1, wherein the auxiliary fluid channel comprises a channel loop and includes a first leg communicated with the main fluid channel and a second leg communicated with the main fluid channel, and wherein the fluid actuator is positioned within one of the first leg and the second leg.

7. The device of claim 1, further comprising:
   a filter positioned before the fluid actuator relative to a direction of fluid flow through the auxiliary fluid channel.

8. A device for microfluidic transport, comprising:
   first and second fluid reservoirs;
   a main fluid channel extended between the first and second fluid reservoirs along a direct path;
   an auxiliary fluid channel communicated with the main fluid channel and including a segment asymmetric to the first and second fluid reservoirs, the auxiliary fluid channel being outside the direct path of the main fluid channel; and
   a fluid actuator within the segment of the auxiliary fluid channel, the fluid actuator to induce fluid flow in the main fluid channel along the direct path between the first and second fluid reservoirs.

9. The device of claim 8, wherein the auxiliary fluid channel is further communicated with one of the first and second fluid reservoirs.

10. The device of claim 8, wherein the auxiliary fluid channel includes another segment communicated with the main fluid channel.

11. The device of claim 8, wherein the auxiliary fluid channel is asymmetric to the main fluid channel.

12. The device of claim 8, wherein the auxiliary fluid channel comprises a channel loop, and the fluid actuator is positioned within the channel loop asymmetric to the main fluid channel.

13. A method of microfluidic transport, comprising:
    communicating a main fluid channel with a first reservoir and a second reservoir spaced from the first reservoir, the main fluid channel providing a direct path between the first reservoir and the second reservoir;
    communicating an auxiliary fluid channel with the main fluid channel, the auxiliary fluid channel being outside the direct path of the main fluid channel; and
    operating a fluid actuator positioned within the auxiliary fluid channel asymmetric to the main fluid channel, including inducing fluid flow in the main fluid channel from the first reservoir toward the second reservoir along the direct path.

14. The method of claim 13, wherein communicating the auxiliary fluid channel with the main fluid channel includes communicating a first end of the auxiliary fluid channel with the first reservoir and communicating a second end of the auxiliary fluid channel with the main fluid channel.

15. The method of claim 13, wherein communicating the auxiliary fluid channel with the main fluid channel includes communicating first and second ends of the auxiliary fluid channel with the main fluid channel.

* * * * *